US012735297B2

(12) United States Patent
Sai

(10) Patent No.: US 12,735,297 B2
(45) Date of Patent: Sep. 15, 2026

(54) CARRIAGE LIFTING/LOWERING DEVICE

(71) Applicant: Murata Machinery, Ltd., Kyoto (JP)

(72) Inventor: Jun Sai, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 532 days.

(21) Appl. No.: 18/285,322

(22) PCT Filed: Feb. 9, 2022

(86) PCT No.: PCT/JP2022/005178
§ 371 (c)(1),
(2) Date: Oct. 2, 2023

(87) PCT Pub. No.: WO2022/215345
PCT Pub. Date: Oct. 13, 2022

(65) Prior Publication Data

US 2024/0182265 A1 Jun. 6, 2024

(30) Foreign Application Priority Data

Apr. 7, 2021 (JP) ................................ 2021-065363

(51) Int. Cl.
*B66B 5/00* (2006.01)
*B66B 9/00* (2006.01)
(Continued)

(52) U.S. Cl.
CPC .............. *B66B 5/0087* (2013.01); *B66B 9/00* (2013.01); *H10P 72/3206* (2026.01); *H10P 72/3218* (2026.01)

(58) Field of Classification Search
CPC ..... B66B 5/0087; B66B 9/00; H10P 72/3206; H10P 72/3218; B61B 3/00; B65G 1/00; B65G 1/04; E04G 1/15
(Continued)

(56) References Cited

U.S. PATENT DOCUMENTS

2017/0044829 A1* 2/2017 Morikawa ................. E06C 9/02

FOREIGN PATENT DOCUMENTS

JP H10-18578 A 1/1998
JP 2002-370807 A 12/2002
(Continued)

OTHER PUBLICATIONS

Shiraki et al. (JP 2019214438 A) Running Facility for Conveying Vehicles (Year: 2019).*
(Continued)

*Primary Examiner* — Jorge L Carrasquillo
(74) *Attorney, Agent, or Firm* — DLA Piper LLP (US)

(57) ABSTRACT

A carriage lifting/lowering device includes: a first lifting/lowering rail; a second lifting/lowering rail; a first lifting/lowering drive unit configured to lift and lower the first lifting/lowering rail; a second lifting/lowering drive unit configured to lift and lower the second lifting/lowering rail; a first body unit configured to movably support the first lifting/lowering rail along a first face in an lifting/lowering direction; a second body unit configured to movably support the second lifting/lowering rail in the lifting/lowering direction, along a second face facing the first face; and a pair of support frames disposed across the first body unit and the second body unit, with a maintenance step being disposed across the pair of support frames. The pair of support frames are disposed in an extending direction of the first lifting/lowering rail and the second lifting/lowering rail, and sandwich a lifting/lowering space.

11 Claims, 11 Drawing Sheets

(51) Int. Cl.
*H01L 21/677* (2006.01)
*H10P 72/30* (2026.01)

(58) Field of Classification Search
USPC .......................................................... 187/247
See application file for complete search history.

(56) References Cited

FOREIGN PATENT DOCUMENTS

| | | | |
|---|---|---|---|
| JP | 2009-73624 | A | 4/2009 |
| JP | 2019-214438 | A | 12/2019 |

OTHER PUBLICATIONS

Osada (JP H07194874 A) Continuous Pressing and Surging Method of Cloth, and Stacker Therefor (Year: 1995).*
Miyake et al. (JP 2001048450 A) Elevator Device (Year: 2001).*
International Search Report dated Apr. 26, 2022 in counterpart International Application No. PCT/JP2022/005178 w/English translation.
Written Opinion dated Apr. 26, 2022 in counterpart International Application No. PCT/JP2022/005178.

* cited by examiner

20(20A)
80
24A
27A
26A
23A
D1
5B(5)
27A
25A
22A
21A
FA
27A
27A
5A(5)
14
15
17
18
10
13A
13
90
19
D1
X
Z
Y

20(20B)
24B
27B
26B
23B
D2
5B(5)
27B
Z
Y
X
25B
22B
21B
FB
27B
5A(5)
13A
13
14
15
17
18
19
90
10
D2

40
41b
41
41a
55A
47d
S1
59
50
50A
50B
51
45
43
67
55
53
47c
47a
47b
47
61
60
65
63
S2
Z
Y
X 40
41
59
45
52
55A
50B(50)
51
70
59
40
45
41a
41
55
52
55A
41a
43
53
VIIIB
Z
Y
X
47a 47c 47b 47d
47
47a
47
47b

50B(50)
52
54
47d
52a
55
49A
49
53
Z
Y
X 40 45 41 70 41a 52 45 50A(50) 59 51 53 40 41 59 47d 54 41a 51 59 Z Y X 50B(50) 47a 52 47 47c 47b 41 40 70 41a 55A 45 50B (50) 43 Z Y X 43a 43a 47c

CARRIAGE LIFTING/LOWERING DEVICE

TECHNICAL FIELD

This disclosure relates to a carriage lifting/lowering device.

BACKGROUND

For example, Japanese Unexamined Patent Publication No. 2019-214438 discloses a traveling facility (carriage lifting/lowering device) that relays the movement of a carrier between a first rail and a second rail, which are laid at different heights from each other. Periodic maintenance is performed on such a traveling facility. Since the traveling facility is located at a high elevation, an operator arranges for an aerial work vehicle and boards a lift of the aerial work vehicle to perform maintenance.

However, work using the aerial work vehicle is inferior in workability because it is performed while moving the lift to each part to be maintained. In addition, when work is performed using the aerial work vehicle, it is necessary to secure a space for the lift to enter around the carriage lifting/lowering device, which increases the size of an entire transport carriage system including the carriage lifting/lowering device.

Therefore, it could be helpful to provide a carriage lifting/lowering device that can improve workability and make the overall size of a transport carriage system more compact.

SUMMARY

We thus provide a carriage lifting/lowering device including: a first lifting/lowering rail and a second lifting/lowering rail that are liftably and lowerably provided corresponding to two respective laid rails parallel to each other in a same plane in an overhang state; a first lifting/lowering drive unit configured to lift and lower the first lifting/lowering rail; a second lifting/lowering drive unit configured to lift and lower the second lifting/lowering rail; a first body unit having a first face orthogonal to an arranging direction of the two laid rails, and configured to movably support the first lifting/lowering rail along the first face in a lifting/lowering direction; a second body unit having a second face facing the first face in the arranging direction, and configured to movably support the second lifting/lowering rail along the second face in the lifting/lowering direction; and a pair of support frames disposed across the first body unit and the second body unit, with a maintenance step being disposed across the pair of support frames, the maintenance step having a boarding face on which an operator is able to board, in which the pair of support frames are disposed in an extending direction of the first lifting/lowering rail and the second lifting/lowering rail, and sandwich a lifting/lowering space in which the first lifting/lowering rail and the second lifting/lowering rail are lifted and lowered.

The carriage lifting/lowering device with this configuration includes the support frames across which the maintenance step is disposed. The operator can board the maintenance step when performing maintenance. The support frames are disposed to sandwich the lifting/lowering space, and thus do not interfere with the lifting and lowering of the first lifting/lowering rail and the second lifting/lowering rail. This allows maintenance work to be performed simply by placing the maintenance step on the support frames. The operator can perform maintenance work by boarding the above maintenance step without having to board a lift of an aerial work vehicle. This improves workability. Furthermore, with the carriage lifting/lowering device with this configuration, there is no need to secure an entry space in the surroundings of the carriage lifting/lowering device for a lift of an aerial work vehicle. This allows the overall size of a transport carriage system, including the carriage lifting/lowering device, to be made more compact.

The carriage lifting/lowering device may further include the maintenance step provided movably between a retracted state, in which the maintenance step retracts from the lifting/lowering space by being placed in an upright position with the boarding face orthogonal to the arranging direction, and an advanced state, in which the maintenance step advances into the lifting/lowering space when the boarding face is placed on the support frames to be orthogonal to the vertical direction. This configuration can eliminate the need to bring the maintenance step from a storage location or the like and install it at the time of maintenance. This further improves workability.

In the carriage lifting/lowering device, the maintenance step may be supported by the support frames at an upper end portion of the maintenance step in the retracted state, the maintenance step in the upright position may be slidable in the vertical direction against the support frames, and the maintenance step may be rotatable to be in the advanced state when a lower end portion of the maintenance step is slid to the support frames. With this configuration, the operator can move the maintenance step from the retracted state to the advanced state simply by pulling the maintenance step upward and then tipping it toward the support frames.

In the carriage lifting/lowering device, the maintenance step may include: a first maintenance step that is provided to advance into the lifting/lowering space of the first lifting/lowering rail in the advanced state; and a second maintenance step that is provided to advance into the lifting/lowering space of the second lifting/lowering rail in the advanced state, and the first maintenance step and the second maintenance step may be disposed in a center between the first body unit in the retracted state and the second body unit in the retracted state. This configuration can reduce the size of the maintenance step pulled up by the operator, which facilitates handling by the operator. In the retracted state, the maintenance step, which is disposed in the upright position between the first body unit and the second body unit, serves as a wall separating the lifting/lowering space of the first lifting/lowering rail from the lifting/lowering space of the second lifting/lowering rail. This can ensure the safety of the operator even if one of the first lifting/lowering rail and the second lifting/lowering rail is activated while the operator is working in the lifting/lowering space of the other of the first lifting/lowering rail and the second lifting/lowering rail.

The carriage lifting/lowering device may further include: a control unit configured to control the first lifting/lowering drive unit and the second lifting/lowering drive unit; a stopper attached to the support frames to maintain the maintenance step in the retracted state; and a detection unit configured to detect whether the stopper is attached to the support frames, in which the control unit may restrict driving of the first lifting/lowering drive unit and the second lifting/lowering drive unit when the detection unit detects that the stopper is not attached. With this configuration, when the stopper is removed by the operator, the lifting and lowering of the first lifting/lowering drive unit and the second lifting/lowering drive unit is prohibited, and thus the safety of the operator can be ensured.

In the carriage lifting/lowering device, the support frames may be provided with a locking portion configured to lock the boarding face of the main-tenance step in the advanced state. This configuration prevents the maintenance step from lifting from the support frames even when some force is applied from below the maintenance step, and thus the safety of the operator can be ensured.

Thus, workability can be improved and the overall size of the transport carriage system can be made more compact.

REFERENCE SIGNS LIST

Figure 1:
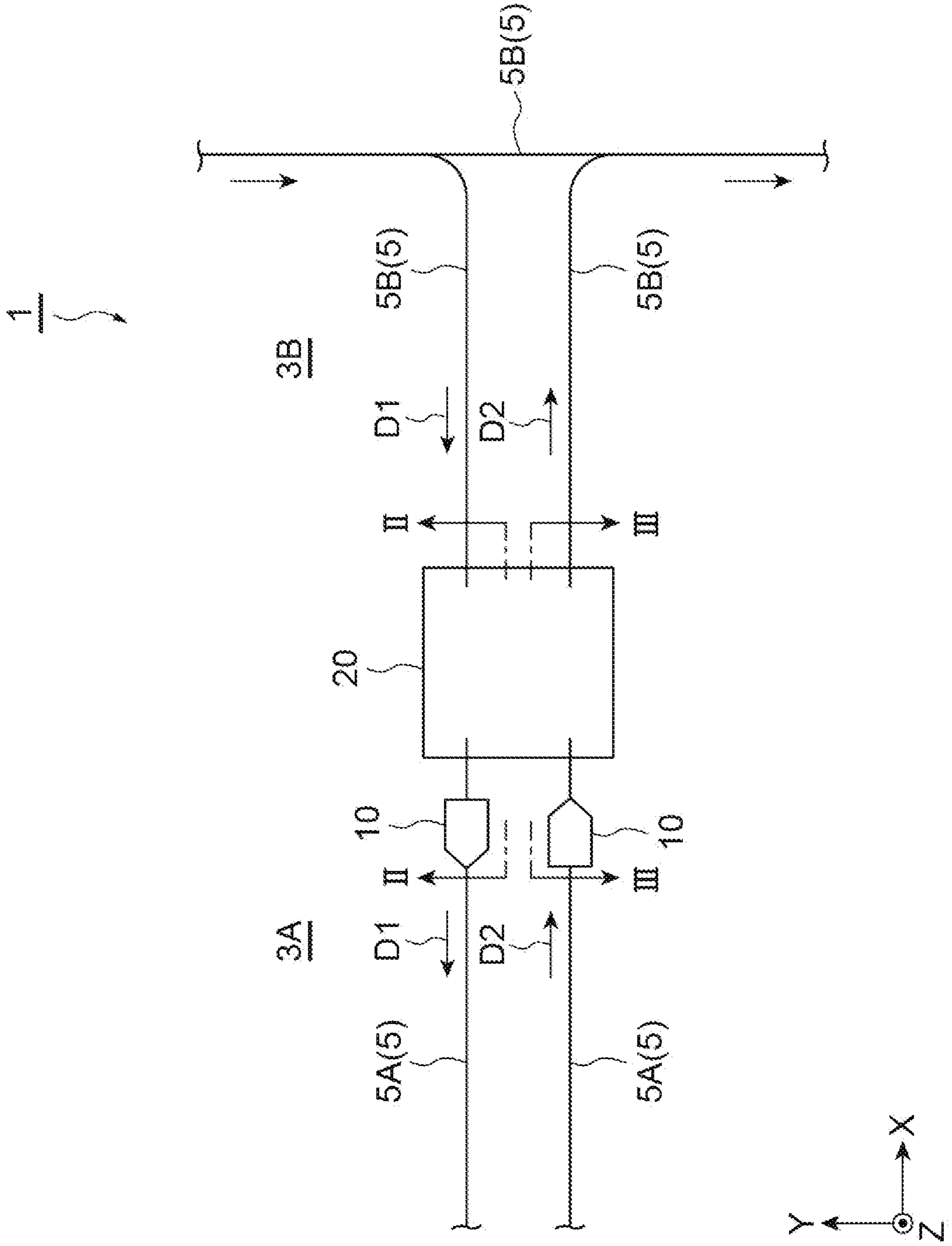
FIG. 1 is a plan view illustrating a part of a transport carriage system in which a carriage lifting/lowering device according to an example is provided.

1 transport carriage system
5A traveling rail (laid rail)
10 transport carriage
20 carriage lifting/lowering device
20A first lifting/lowering device
20B second lifting/lowering device
21A first lifting/lowering rail
21B second lifting/lowering rail
22A first lifting/lowering unit
22B second lifting/lowering unit
24A first body unit
24B second body unit
25A first lifting/lowering drive unit
25B second lifting/lowering drive unit
40 support frame
41 flat plate portion
50 locking portion
50 maintenance step
50A first maintenance step
50B second maintenance step
54 boarding face
60 stopper
70 switch (detection unit)
80 controller (control unit)
85 emergency stop button
90 article
S1, S2 lifting/lowering space
FA first face
FB second face

DETAILED DESCRIPTION

One preferred example of our device is described in detail with reference to the drawings. In the description of the drawings, like elements are designated by like reference signs, and duplicate description is omitted.

A transport carriage system 1 illustrated in FIG. 1, in which a carriage lifting/lowering device 20 according to an example is used, is a system configured to transport an article 90 using a transport carriage 10 configured to move along a traveling rail 5 suspended from a ceiling or the like. Examples of the article 90 (see FIG. 2) include a container such as front opening unified pod (FOUP) that stores a plurality of semiconductor wafers and a reticle pod that stores a glass substrate, as well as general components. The transport carriage system 1 includes traveling rails (laid rails) 5A that constitute a plurality of intrabays 3A, in each of which a processing device for the article 90 and other equipment are disposed, and traveling rails 5B that constitute an interbay 3B connecting the intrabays 3A. The traveling rails 5A, which constitute the intrabays 3A according to this example, are laid higher than the traveling rails 5B, which constitute the interbay 3B. The carriage lifting/lowering device 20 according to this example is installed at end portions of the traveling rails 5A, which constitute the intrabays 3A, and relays the movement of each transport carriage 10 between the traveling rails 5A and the traveling rails 5B by a first lifting/lowering rail 21A and a second lifting/lowering rail 21B (see FIGS. 2 to 4).

Figure 6:
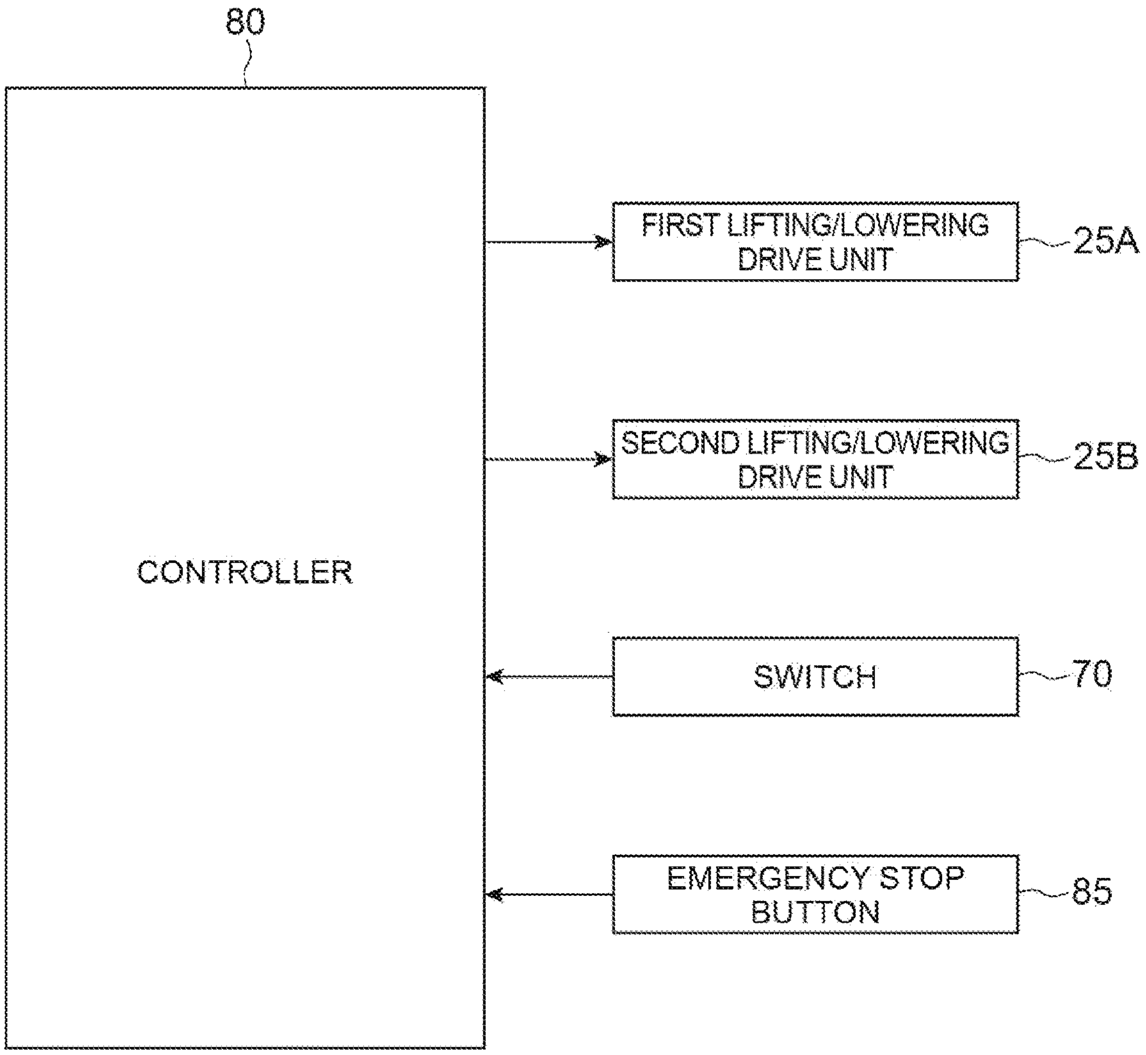
FIG. 6 is a block diagram illustrating a functional configuration of the carriage lifting/lowering device.

For convenience of explanation, an X direction, a Y direction, and a Z direction are set orthogonal to each other in all drawings except FIG. 6. The X direction is the extending direction of the traveling rails 5A, the traveling rails 5B, the first lifting/lowering rail 21A, and the second lifting/lowering rail 21B, as illustrated in FIG. 1; the Y direction is the arranging direction of the traveling rails 5A (width direction of the transport carriage 10); and the Z direction is the lifting/lowering direction of the first lifting/lowering rail 21A and the second lifting/lowering rail 21B, the Z direction also being the vertical direction.

Figure 2:
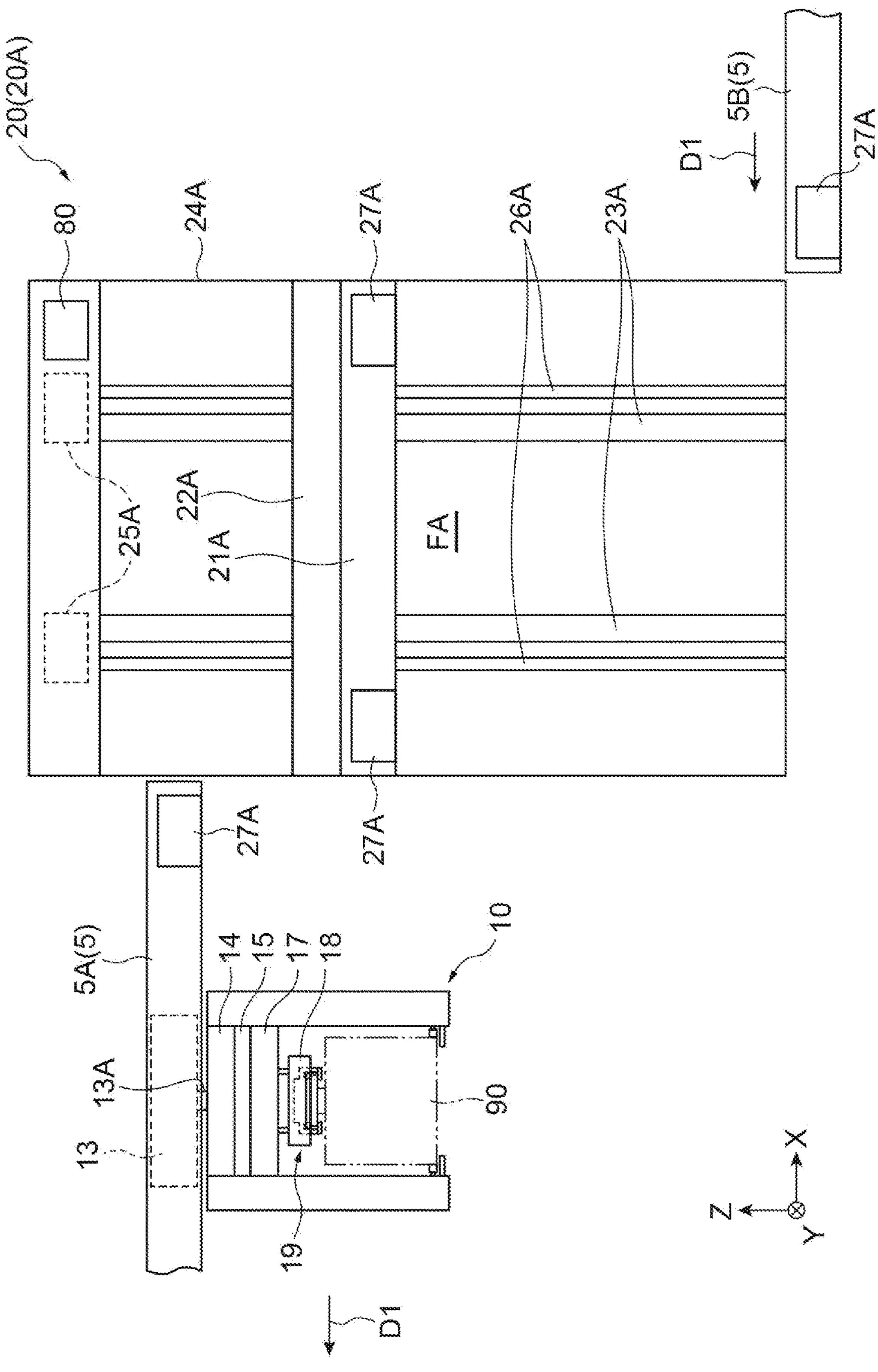
FIG. 2 is a front view of the carriage lifting/lowering device with a first lifting/lowering unit at the front.

This section describes the transport carriage 10 that is lifted and lowered by the carriage lifting/lowering device 20 described above. As illustrated in FIG. 2, the transport carriage 10 includes a traveling drive unit 13, a horizontal drive unit 14, a rotary drive unit 15, a lifting/lowering drive unit 17, a lifting/lowering device 18, and a holding device 19.

The traveling drive unit 13 moves the transport carriage 10 along a corresponding one of the traveling rails 5. The traveling drive unit 13 is disposed in a space formed by the traveling rail 5. The traveling drive unit 13 drives a roller (not illustrated) configured to travel on the traveling rail 5. The horizontal drive unit 14 is connected to a lower part of the traveling drive unit 13 via a shaft 13A. The horizontal drive unit 14 moves the rotary drive unit 15, the lifting/lowering drive unit 17, and the lifting/lowering device 18 in a direction (Y direction) orthogonal to the extending direction of the traveling rail 5 (X direction) in a horizontal plane. The rotary drive unit 15 rotates the lifting/lowering drive unit 17 and the lifting/lowering device 18 in the horizontal plane. The lifting/lowering drive unit 17 lifts and lowers the lifting/lowering device 18 by winding and paying out four belts. The lifting/lowering device 18 is provided to be able to be lifted and lowered by the lifting/lowering drive unit 17, and functions as a lifting/lowering platform in the transport carriage 10. The holding device 19 holds the article 90.

Next, the carriage lifting/lowering device 20 of the transport carriage 10 is described. The carriage lifting/lowering device 20 is disposed at the end portions of two traveling rails 5A and 5A, which are laid parallel to each other in the same plane in an overhang state, and the carriage lifting/lowering device 20 lifts and lowers the transport carriage by lifting and lowering the first lifting/lowering rail 21A and the second lifting/lowering rail 21B in the vertical direction.

Figure 3:
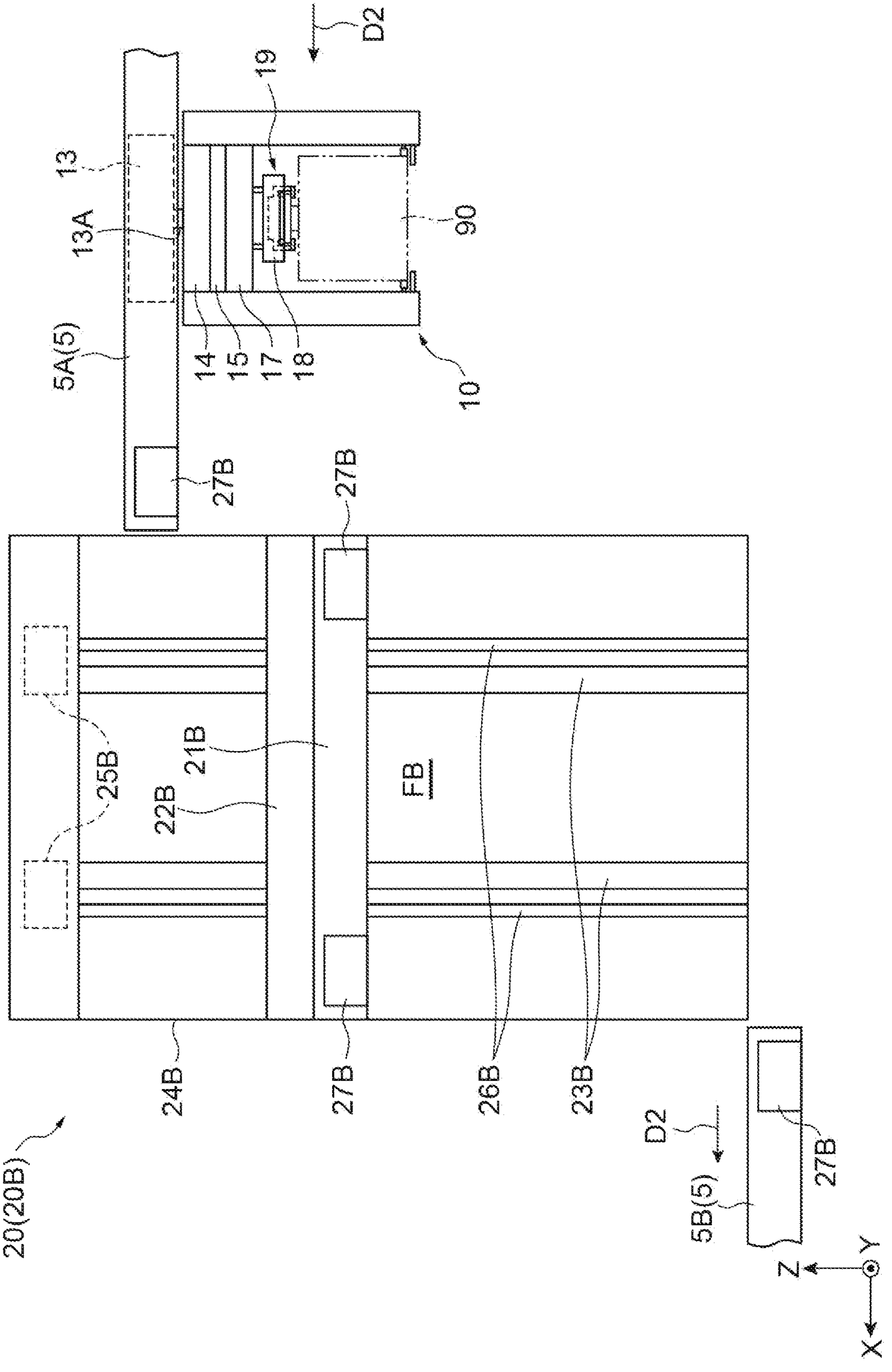
FIG. 3 is a front view of the carriage lifting/lowering device with a second lifting/lowering unit at the front.
Figure 4:
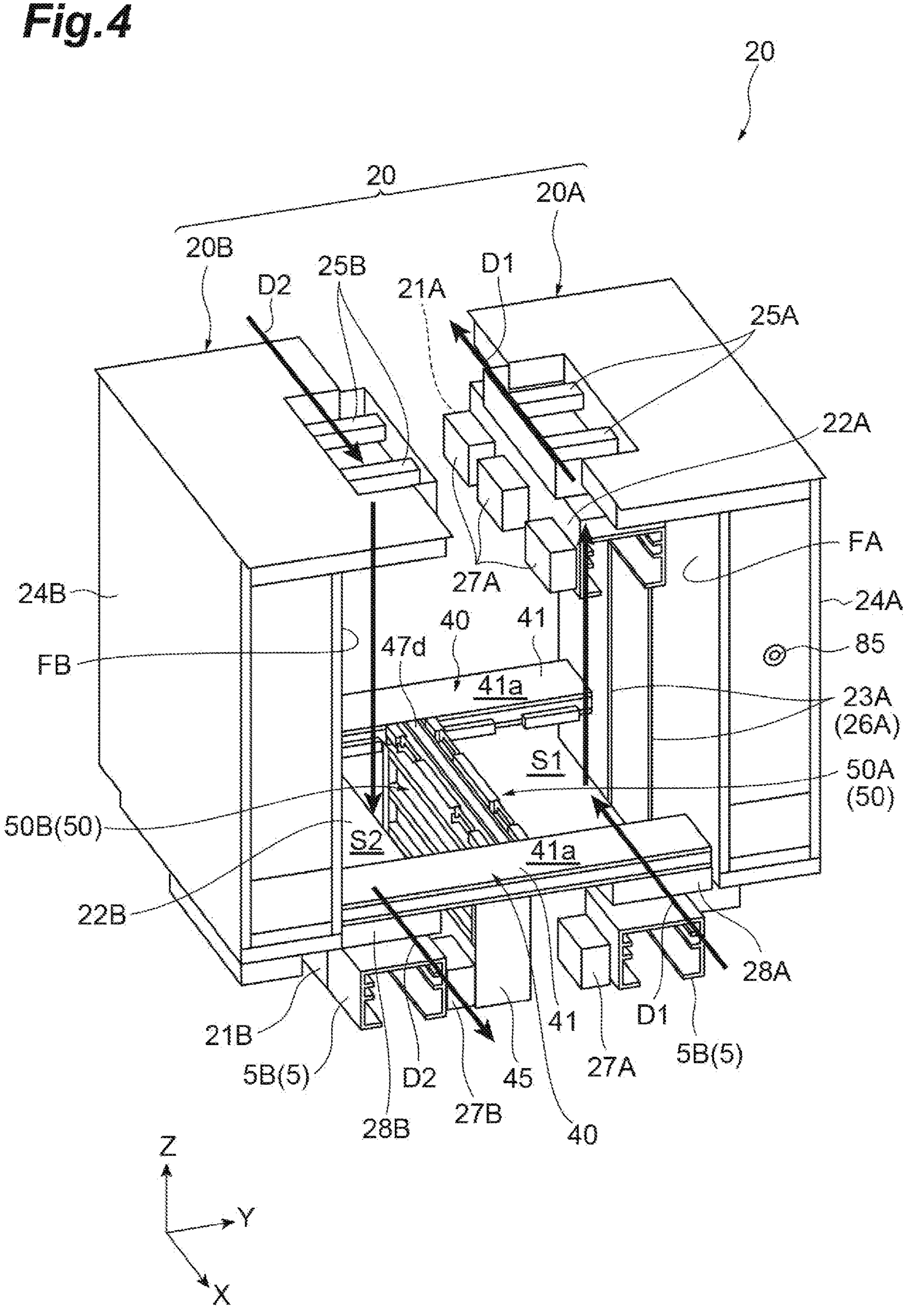
FIG. 4 is a perspective view of the carriage lifting/lowering device with a maintenance step in a retracted state.

As illustrated in FIGS. 2 to 4, the carriage lifting/lowering device 20 includes a first lifting/lowering device 20A, a second lifting/lowering device 20B, a pair of support frames 40 and 40, two maintenance steps 50 and 50 (first maintenance step 50A and second maintenance step 50B) and a stopper 60 (see FIG. 7), and a controller (control unit) 80.

As illustrated in FIG. 2, the first lifting/lowering device 20A includes the first lifting/lowering rail 21A, a first lifting/lowering unit 22A, a first body unit 24A, a first lifting/lowering drive unit 25A, and first stopper units 27A.

The first lifting/lowering rail 21A is one of the rails provided for the respective two traveling rails 5A and 5A. The first lifting/lowering rail 21A moves in the vertical direction between the end portion of the traveling rail 5A and the end portion of the traveling rail 5B, which is spaced in the vertical and horizontal directions from the traveling rail 5A. The first lifting/lowering rail 21A is movable between a position where the first lifting/lowering rail 21A is connected to the traveling rail 5A (i.e., the position where the transport carriage 10 can come and go between the traveling rail 5A and the first lifting/lowering rail 21A) and a position where the first lifting/lowering rail 21A is connected to the traveling rail 5B (i.e., the position where the transport carriage 10 can come and go between the traveling rail 5B and the first lifting/lowering rail 21A). The first lifting/lowering rail 21A is fixed to the first lifting/lowering unit 22A.

The first lifting/lowering unit 22A is attached to the first body unit 24A, which extends in the vertical direction, via linear guides 23A. The first lifting/lowering unit 22A is movable in the vertical direction with respect to the first body unit 24A. The first body unit 24A supports the first lifting/lowering unit 22A and the first lifting/lowering drive unit 25A. The first body unit 24A has a first face FA orthogonal to the arranging direction (Y direction) of the two traveling rails 5A and 5A, and movably supports the first lifting/lowering rail 21A along the first face FA in the lifting/lowering direction. The first body unit 24A houses the controller 80, which is later described in detail, and an emergency stop button 85 or the like is disposed in the first body unit 24A.

The first lifting/lowering drive unit 25A is supported by the first body unit 24A. The first lifting/lowering drive unit 25A lifts and lowers the first lifting/lowering rail 21A along the vertical direction by moving the first lifting/lowering unit 22A along the first body unit 24A ("the first lifting/lowering drive unit 25A lifts and lowers the first lifting/lowering rail 21A"). An example of the first lifting/lowering drive unit 25A is a servo motor. The drive power of the first lifting/lowering drive unit 25A is transmitted to the first lifting/lowering unit 22A via timing belts 26A. The first lifting/lowering drive unit 25A is provided with an encoder. The encoder can detect, for example, the state of the servo motor such as the amount of rotation, rotation speed, and the direction of rotation. The drive of the first lifting/lowering drive unit 25A is controlled by the controller 80.

The first stopper units 27A are provided on the end portion of the travel-ing rail 5A, on the end portion of the traveling rail 5B, and on both end portions of the first lifting/lowering rail 21A. Each of the first stopper units 27A includes a stopper, a stopper drive unit, a housing and the like. The first stopper units 27A restrict the travel of the transport carriage 10 when the end portion of the traveling rail 5A and one end of the first lifting/lowering rail 21A are not in a connected state (not in a state in which the transport carriage 10 can move) and when the end portion of the traveling rail 5B and the other end of the first lifting/lowering rail 21A are not in the connected state. This prevents the transport carriage 10 from falling from the end portion of the traveling rail 5A, the end portion of the traveling rail 5B, and both end portions of the first lifting/lowering rail 21A.

As illustrated in FIG. 3, the second lifting/lowering device 20B includes the second lifting/lowering rail 21B, a second lifting/lowering unit 22B, a second body unit 24B, a second lifting/lowering drive unit 25B, and second stopper units 27B. The second lifting/lowering rail 21B is the other of the rails provided for the respective two traveling rails 5A and 5A. The configuration of the second lifting/lowering device 20B matches that of the first lifting/lowering device 20A, except that the controller 80 and the emergency stop button 85 (see FIG. 4) provided in the first body unit 24A of the first lifting/lowering device 20A are not provided in the second body unit 24B of the second lifting/lowering device 20B. In other words, the functional configurations of the second lifting/lowering rail 21B, the second lifting/lowering unit 22B, linear guides 23B, the second body unit 24B, a second face FB, the second lifting/lowering drive unit 25B, timing belts 26B, and second stopper units 27B are the same as the functional configuration of the first lifting/lowering rail 21A, the first lifting/lowering unit 22A, the linear guides 23A, the first body unit 24A, the first face FA, the first lifting/lowering drive unit 25A, the timing belts 26A, and the first stopper units 27A, and thus detailed description of the configuration of the second lifting/lowering device 20B is omitted.

The first lifting/lowering device 20A is a lifting/lowering device dedicated to lifting that moves the transport carriage 10 traveling on the traveling rail 5B in one direction (D1 direction) to the first lifting/lowering rail 21A, as illustrated in FIG. 1, upward to the connection position with the traveling rail 5A, as illustrated in FIG. 4. On the other hand, the second lifting/lowering device 20B is a lifting/lowering device dedicated to lowering that moves the transport carriage 10 traveling on the traveling rail 5A in one direction (D2 direction) to the second lifting/lowering rail 21B, as illustrated in FIG. 1, downward to the connection position with the traveling rail 5B, as illustrated in FIG. 4.

Figure 5:
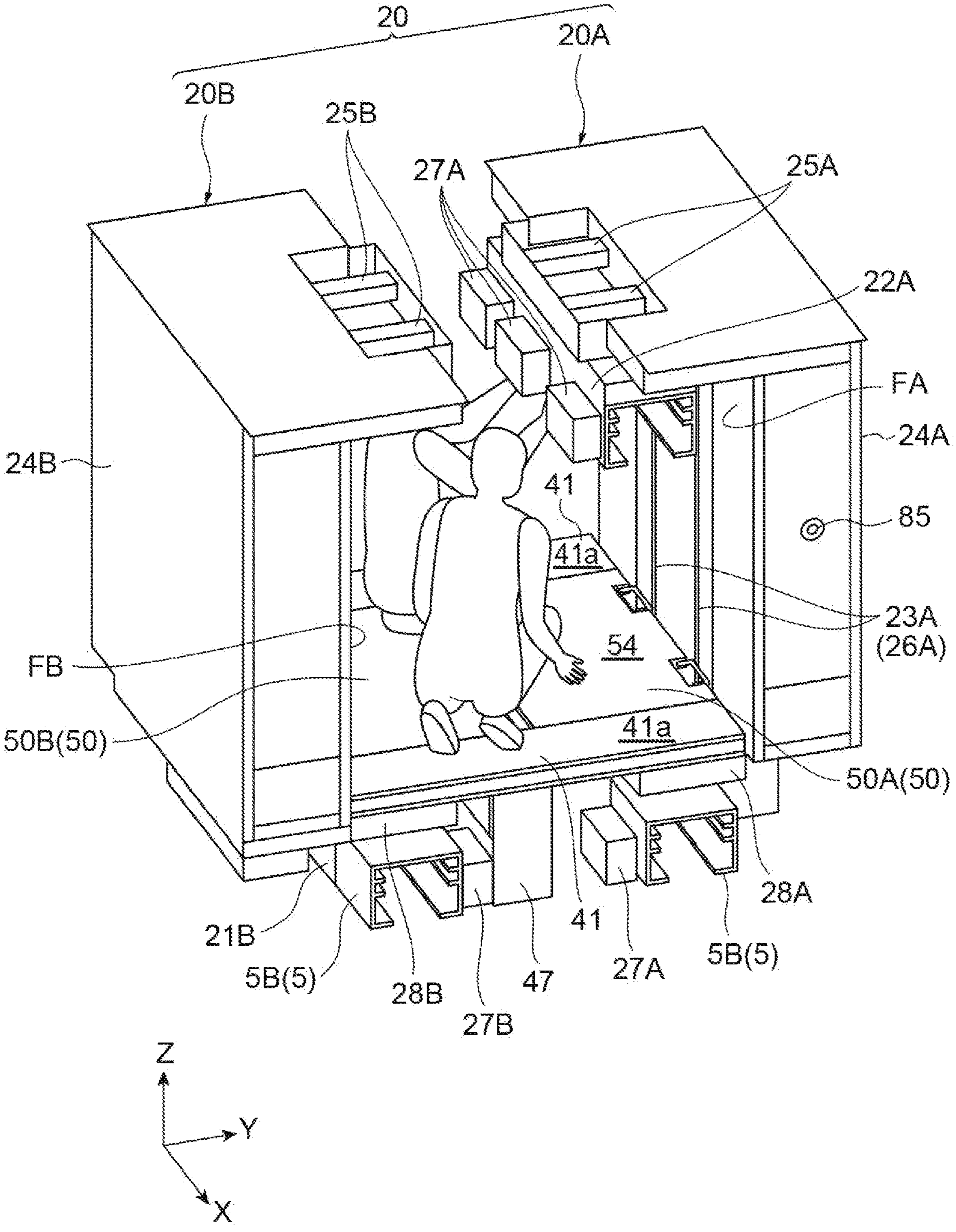
FIG. 5 is a perspective view of the carriage lifting/lowering device with the maintenance step in an advanced state.

As illustrated in FIGS. 4 and 5, the pair of support frames 40 and 40 are disposed across the first body unit 24A and the second body unit 24B. The pair of support frames 40 and 40 are placed on a projecting portion 28A provided on the first body unit 24A and a projecting portion 28B provided on the second body unit 24B, thereby extending across the first body unit 24A and the second body unit 24B. The maintenance steps 50 with boarding faces 54 on which an operator can board, are to be placed on the pair of support frames 40 and 40.

The pair of support frames 40 and 40 are disposed side by side in the extending direction (X direction) of the first lifting/lowering rail 21A and the sec-ond lifting/lowering rail 21B to sandwich a lifting/lowering space S1 in which the first lifting/lowering rail 21A is lifted and lowered and a lifting/lowering space S2 in which the second lifting/lowering rail 21B is lifted and lowered. In other words, the pair of support frames 40 and 40 do not interfere with the lifting and lowering of the transport carriage 10 by the first lifting/lowering rail 21A and the lifting and lowering of the transport carriage 10 by the second lifting/lowering rail 21B.

Each of the support frames 40 has a flat plate portion 41, placing portions 43, locking portions 45, a housing portion 47, a stopper 60, and switches (detection unit) 70 and 70, as illustrated in FIGS. 4 to 7. The flat plate portion 41 is a flat plate member with a mounting face 41*a* on which the operator can board. The placing portions 43 are the portions on which the maintenance steps 50 are placed, the plurality (e.g., four) of placing portions 43 being formed on a side portion 41*b* of the flat plate portion 41. Each of the placing portions 43 has a placing face 43*a* (see FIG. 10(B)) that supports the maintenance step 50. The maintenance steps 50 are disposed across the support frames 40 by being placed on the placing portions 43.

Figure 11:
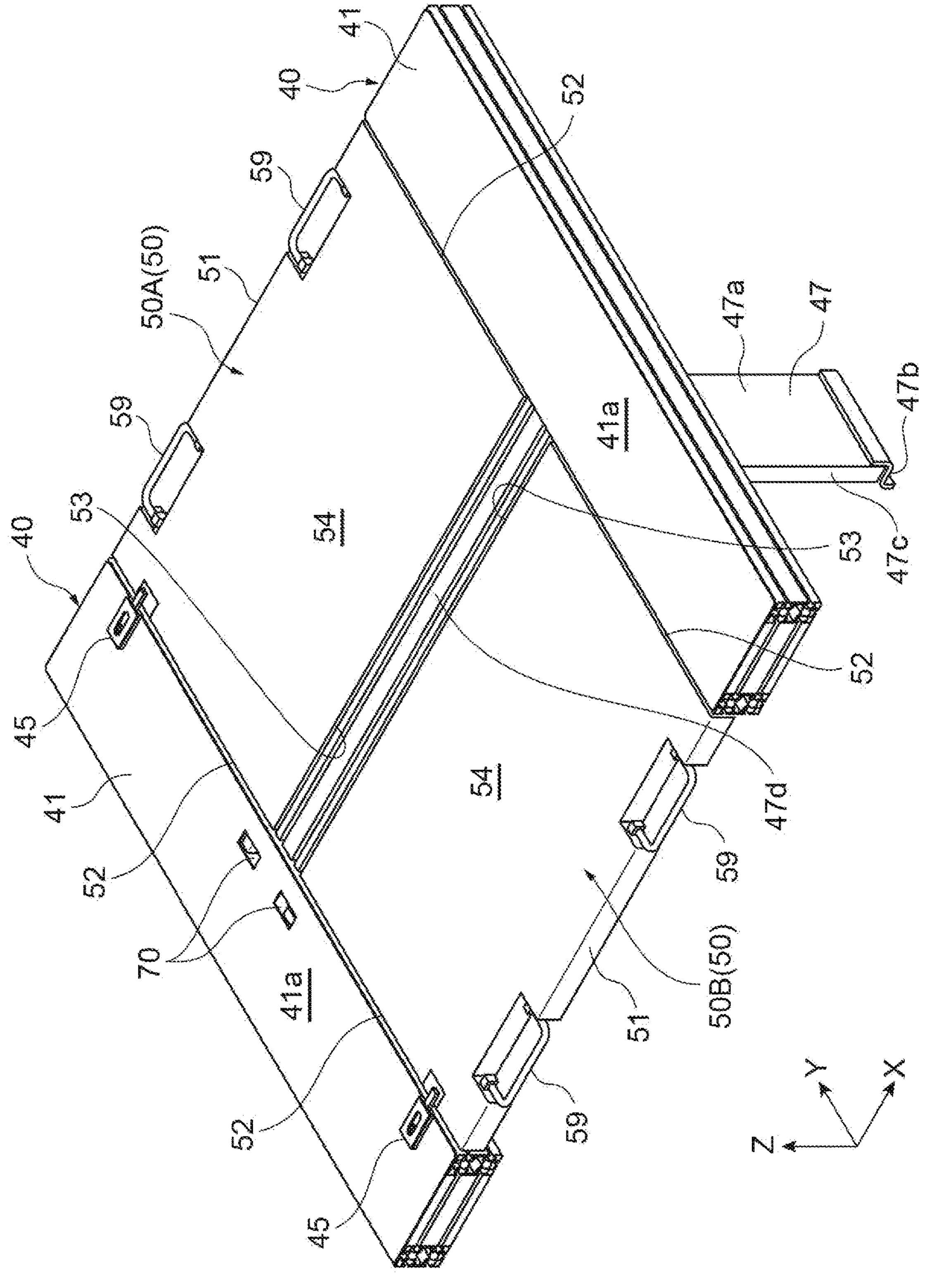
FIG. 11 is a perspective view illustrating the maintenance step in the advanced state.

The locking portions 45 are provided to be able to advance in the X direction so that the locking portions 45 contact the boarding faces 54 of the maintenance steps 50 when the maintenance steps 50 are placed on the support frames 40 (see FIG. 11). In other words, the locking portions 45 lock the maintenance steps 50 from above. The locking portions 45 prevent the maintenance steps 50 from lifting upward from below in the lifting/lowering direction of the first lifting/lowering rail 21A and the second lifting/lowering rail 21B.

The housing portion 47 houses the two maintenance steps 50 and 50 (first maintenance step 50A and second maintenance step 50B) in the retracted state. The retracted state of the maintenance steps 50 is described in detail in a later section. The housing portion 47 has a side portion 47*a*, a bottom face portion 47*b*, guide portions 47*c*, and a divider portion 47*d*. The side portion 47*a* is formed to face the side end portions 52 of the maintenance steps 50 in the retracted state. The bottom face portion 47*b* is formed to face the lower end portions 53 of the maintenance steps 50 in the retracted state. The bottom face portion 47*b* supports the lower end portions 53 of the maintenance steps 50 in the retracted state. Each of the guide portions 47*c* is formed to face a bottom face 55 of the corresponding maintenance step 50 in the retracted state. The guide portion 47*c* guides the bottom face 55 of the maintenance step 50 movable from the advanced state to the retracted state and the bottom face 55 of the maintenance step 50 movable from the retracted state to the advanced state. The divider portion 47*d* is disposed across the pair of support frames 40 and 40. The divider portion 47*d* is disposed at a position where the divider portion 47*d* is interposed between the two maintenance steps 50 and 50 (first maintenance step 50A and second maintenance step 50B) in the retracted state.

Figure 7:
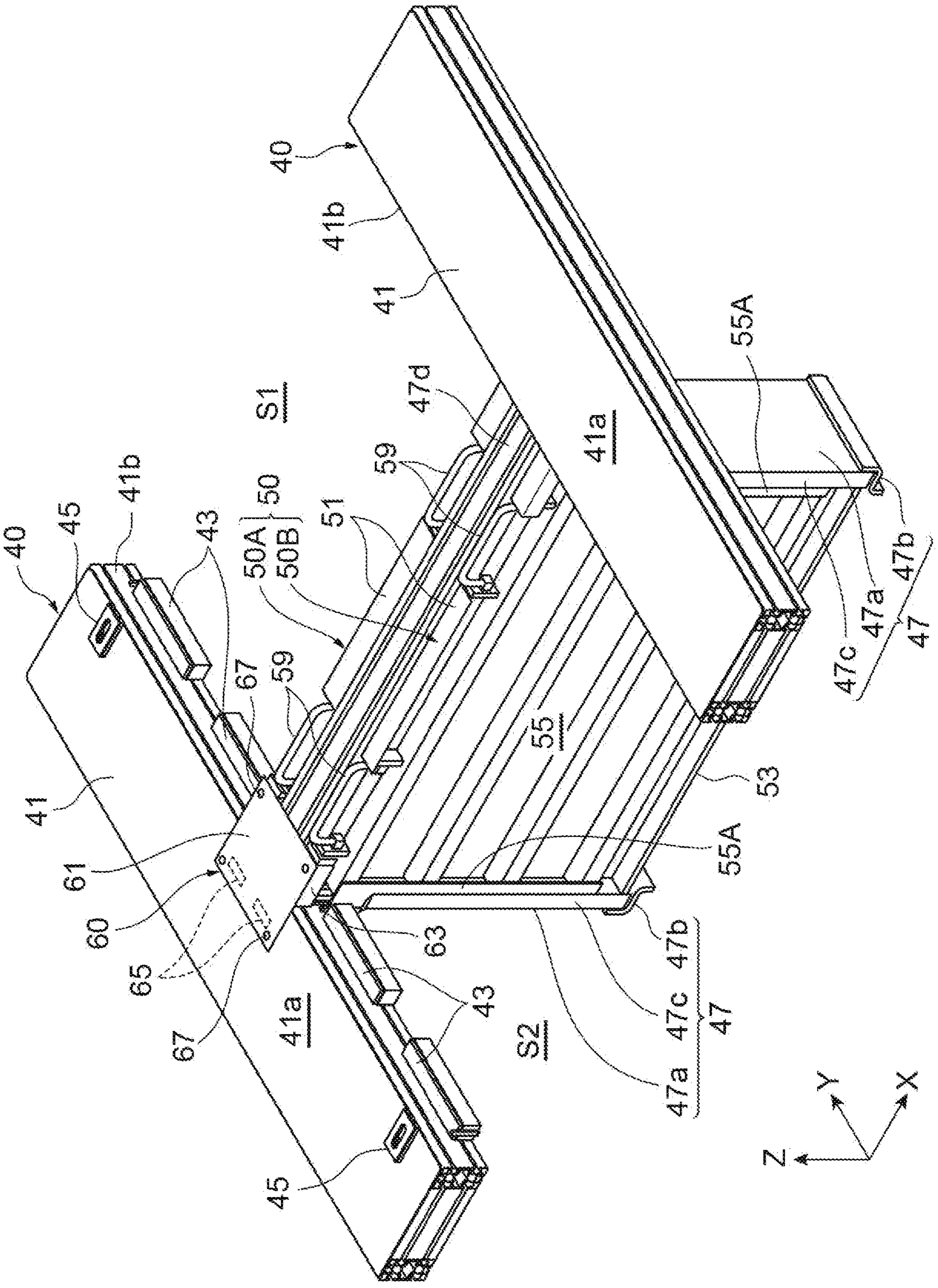
FIG. 7 is a perspective view illustrating the maintenance step in the retracted state.
Figure 8A:
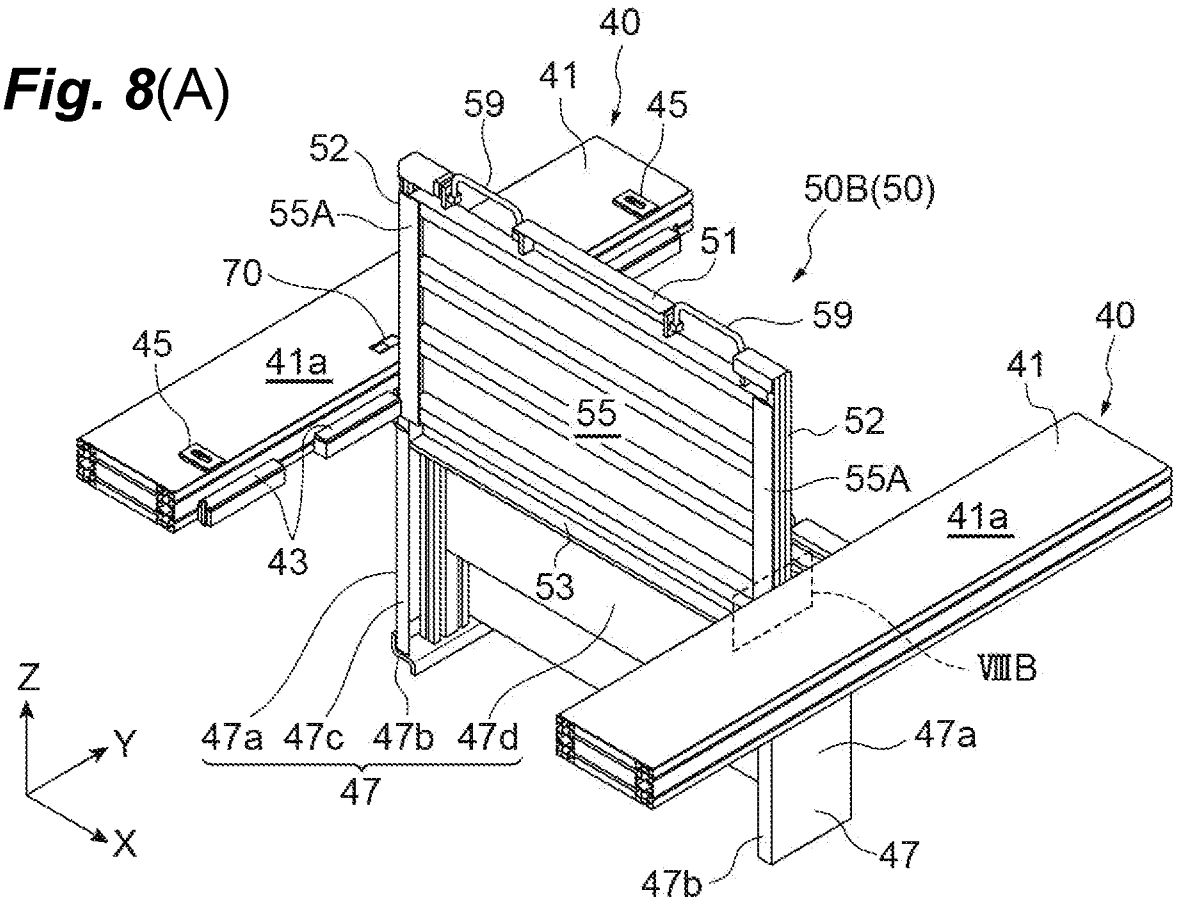
FIG. 8(A) is a perspective view of the maintenance step in the retracted state when it is pulled up.

As illustrated in FIGS. 7 and 8(A), the stopper 60 is removably provided to the support frame 40. The stopper 60 is attached to the support frame 40 to maintain the maintenance steps 50 in the retracted state. The stopper 60 has a flat plate portion 61, a restricting portion 63, and protruding portions 65. The flat plate portion 61 is formed in a rectangular shape in plan view from above. The flat plate portion 61, when attached to the support frame 40, partially covers the flat plate portion 41 of the support frame 40 and upper end portions 51 of the maintenance steps 50 in the retracted state. The stopper 60 is fixed to the support frame 40 with screws 67 that are inserted into screw holes formed in the flat plate portion 61. The protruding portions 65 are formed on the back of the flat plate portion 61 and contact the respective switches 70 and 70 so that the switches 70 and 70 are in an on state in the attached state described above.

The switches 70 and 70 detect whether the stopper 60 is attached to the support frame 40. The switches 70 and 70 are contact switches, for example, and are contactable by the protruding portions 65 of the stopper 60 as described above. A detection result of the stopper 60 by the switches 70 and 70 is obtained by the controller 80.

The maintenance steps 50 are provided movably between the retracted state (see FIG. 4), in which the maintenance steps 50 retract from the lifting/low-ering spaces S1 and S2 by being placed in an upright position with the boarding faces 54 orthogonal to the Y direction (arranging direction), and the advanced state (see FIG. 5), in which the maintenance steps 50 advance into the lifting/lowering spaces S1 and S2 by being placed on the support frames 40 with the boarding faces 54 orthogonal to the Z direction (lifting/lowering direction). The maintenance steps 50 include the first maintenance step 50A that is provided to advance into the lifting/lowering space S1 of the first lifting/lowering rail 21A and the second maintenance step 50B that is provided to advance into the lifting/lowering space S2 of the second lifting/lowering rail 21B in the advanced state. The first maintenance step 50A and the second maintenance step 50B in the retracted state are disposed in the center between the first body unit 24A and the second body unit 24B. The first maintenance step 50A and the second maintenance step 50B are hereinafter collectively referred to as the maintenance step 50.

As illustrated in FIGS. 5, 7, and 8(A), the maintenance step 50 has the upper end portion 51 that is the upper end portion in the retracted state, the side end portions 52 and 52 that are the side end portions, and the lower end portion 53 that is the lower end portion, and has the boarding face 54 that is the portion on which the operator boards in the advanced state, the bottom face 55 opposite the boarding face 54, and handles 59. Reinforcing portions 55A are disposed on the bottom face 55 where the support frames 40 contact when the maintenance step 50 is placed on the support frames 40. The reinforcing portions 55A are a flat plate-like member extending along the respective side end portions 52. The handles 59 are provided on the upper end portion 51, and attachments of the handles 59 to the upper end portion 51 are rotatable. This makes it easier for the operator to grasp the maintenance step 50 in any rotational state.

Figure 8B:
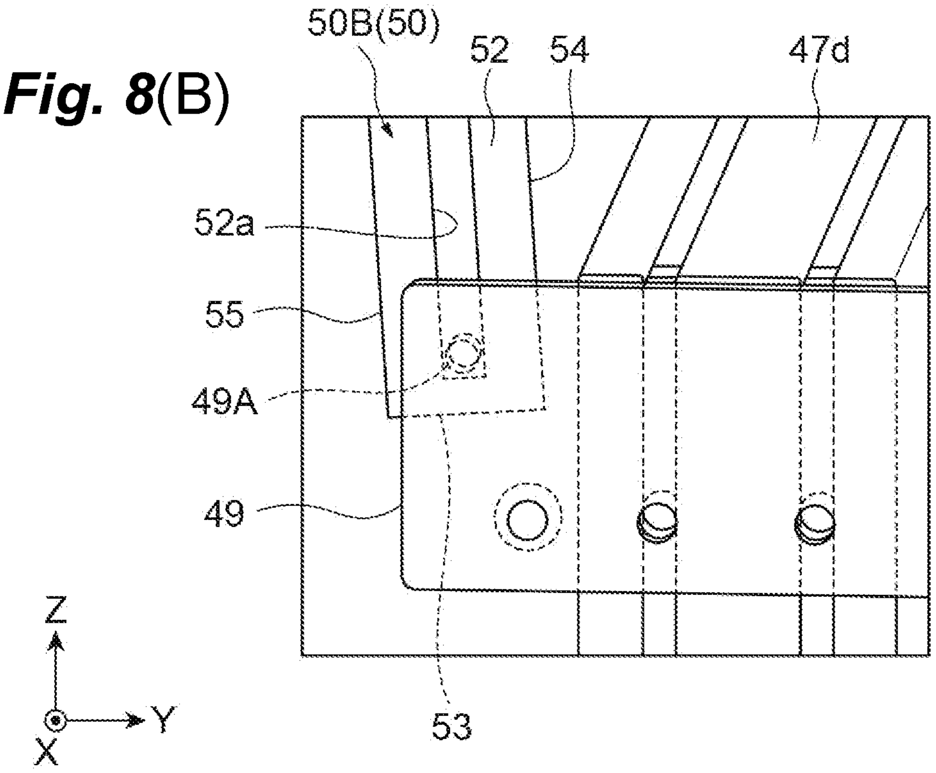
FIG. 8(B) is an enlarged perspective view illustrating an area near a lower end portion of a side portion of the maintenance step illustrated in FIG. 8(A).
Figure 9:
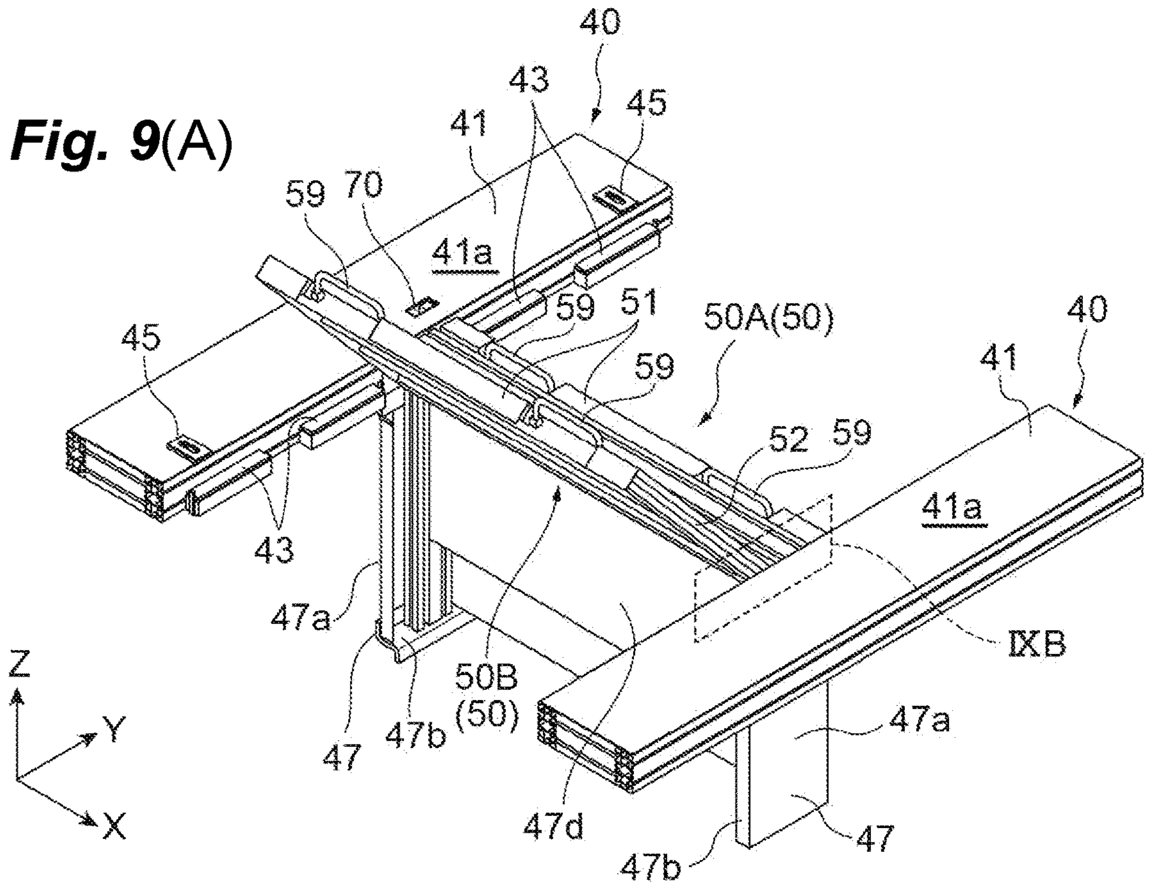
FIG. 9(A) is a perspective view illustrating a process in which the maintenance step in the retracted state has been pulled up and is being rotated.
FIG. 9(B) is an enlarged perspective view illustrating an area near a lower end portion of a side portion of the maintenance step illustrated in FIG. 9(A).
Figure 9:
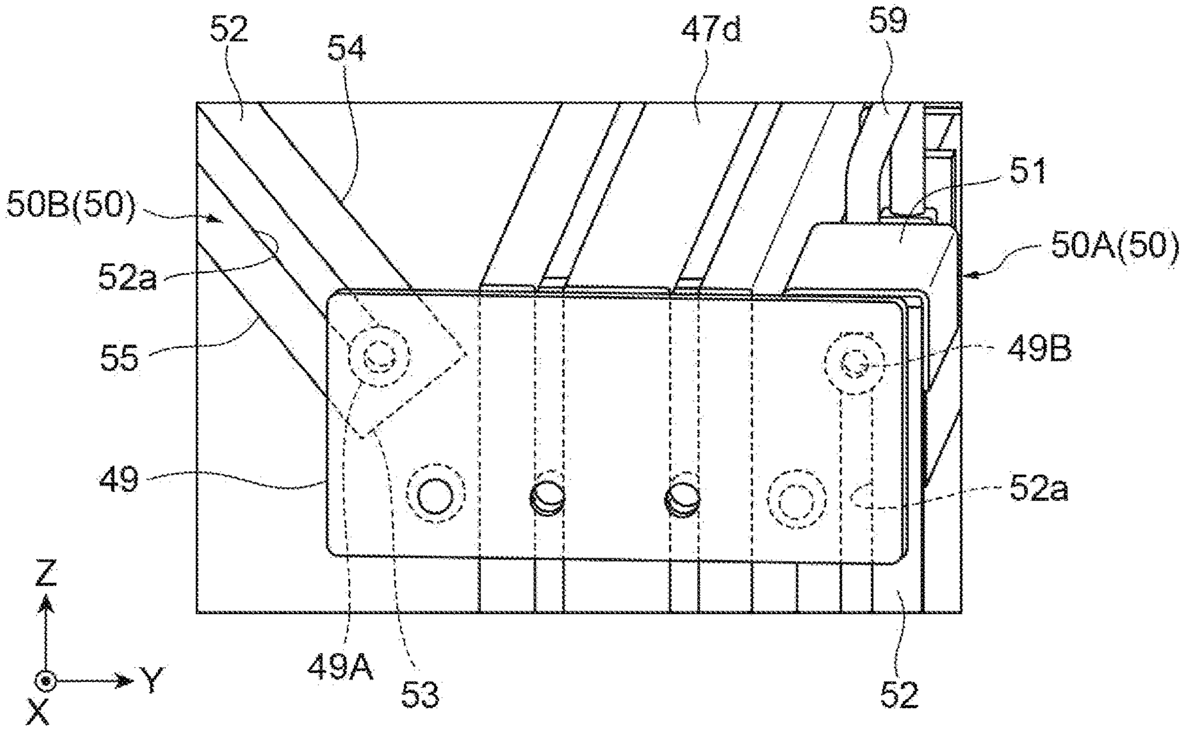

As illustrated in FIGS. 8(B) and 9(B), grooves 52*a* are formed in the respective side end portions 52 and 52. The grooves 52*a* are designed to engage respective pins 49A and 49B provided through a flat plate 49 in the side portion 41*b* of the support frame 40. In this configuration, the maintenance step 50 in the retracted state is supported by the pin 49A or 49B provided on the support frame 40 at its upper end portion 51, and the maintenance step 50 in the upright position is slidable in the Z direction against the support frame 40. The maintenance step 50 is rotatable to be in the advanced state (see FIG. 4) when the lower end portion 53 is slid to the position of the support frame 40.

The controller 80, illustrated in FIGS. 2 and 6, controls each unit in the carriage lifting/lowering device 20. In this example, the controller 80 is provided to the first body unit 24A of the carriage lifting/lowering device 20. The controller 80 includes a central processing unit (CPU), a random access memory (RAM), a read only memory (ROM) and the like. In the controller 80, hardware such as CPU, RAM, and ROM, and software such as programs work together to perform various controls.

The controller 80 restricts driving of the first lifting/lowering drive unit 25A and second lifting/lowering drive unit 25B when the switches 70 and 70 detect that the stopper 60 is not attached. More specifically, when the stopper 60 is removed from the support frame 40 and the protruding portions 65 of the stopper 60 are not in contact with the switches 70 and 70, the first lifting/lowering drive unit 25A and the second lifting/lowering drive unit 25B are prohibited from being driven.

A procedure for the operator to move the maintenance step 50 from the retracted state to the advanced state when using the support frame 40 and the maintenance step 50 in the configuration described above is described below. The operator boards the support frame 40 of the carriage lifting/lowering device 20, for example, by using a ladder or a walkway accessible to the carriage lifting/lowering device 20. The operator removes the stopper 60, which is fixed to the support frame 40 with the screws 67. This allows the maintenance step 50 to be moved upward.

The operator, while boarding the support frame 40, grasps the handles 59 of the maintenance step 50 in the retracted state illustrated in FIG. 7 and pulls the maintenance step 50 upward, as illustrated in FIG. 8(A). The operator slides the maintenance step 50 upward until the lower end of the groove 52*a* engages the pin 49A, as illustrated in FIG. 8(B). Next, the operator rotates the maintenance step 50 as illustrated in FIG. 9(A) so that the maintenance step 50 contacts and is supported on the placing faces 43*a* of the placing portions 43 illustrated in FIG. 10(B). This allows the maintenance step 50 to be in the advanced state, as illustrated in FIG. 10(A).

Next, a procedure for the operator to move the maintenance step 50 from the advanced state to the retracted state is described. The operator, while boarding the support frame 40 or the other maintenance step 50 different from the target maintenance step 50, grasps the handles 59 of the maintenance step 50 illustrated in FIG. 10(A) and rotates the maintenance step 50 as illustrated in FIG. 9(A). The operator places the maintenance step 50 in the upright state, as illustrated in FIG. 8(A), and moves the maintenance step 50 downward along the housing portions 47 and into the housing portions 47 as illustrated in FIG. 7. Cushioning materials (not illustrated) are provided at the parts of the housing portions 47 where the maintenance step 50 contacts. This reduces the impact of the collision between the maintenance step 50 and the housing portions 47 when the maintenance step 50 is moved, preventing damage to the maintenance step 50. The operator retreats from the carriage lifting/lowering device 20 using, for example, a ladder or a walkway accessible to the carriage lifting/lowering device 20.

Next, the advantageous effects of the carriage lifting/lowering device 20 are described. As illustrated in FIG. 4, the carriage lifting/lowering device 20 according the above example includes the pair of support frames 40 and 40 across which the maintenance step 50 is disposed. The operator can board the mainten-ance step 50 when performing maintenance. The pair of support frames 40 and 40 are disposed to sandwich the lifting/lowering spaces S1 and S2, and thus do not in-terfere with the lifting and lowering of the first lifting/lowering rail 21A and the second lifting/lowering rail 21B. This allows maintenance work to be performed simply by placing the maintenance step 50 on the support frames 40. The operator can perform maintenance work by boarding the maintenance step 50 without hav-ing to board a lift of an aerial work vehicle. This improves workability. Furthermore, with the carriage lifting/lowering device 20 with this configuration, there is no need to secure an entry space in the carriage lifting/lowering device 20 for a lift of an aerial work vehicle. This allows the overall size of the transport carriage sys-tem, including the carriage lifting/lowering device 20, to be made more compact.

The maintenance step 50 according to the above example is provided movably between the retracted state, in which the maintenance step 50 retracts from the lifting/lowering space S1 or S2 by being placed in an upright position with the boarding face 54 orthogonal to the Y direction (arranging direction), and the advanced state, in which the maintenance step 50 advances into the lifting/lowering space S1 or S2 by being placed on the support frames 40 with the boarding face 54 orthogonal to the lifting/lowering direction. This can eliminate the need to bring the maintenance step 50 from a storage location or the like and install it at the time of maintenance. This further improves workability.

In the retracted state illustrated in FIG. 7, the maintenance step 50 according to the above example is supported by the support frames 40 at its upper end portion 51, and the maintenance step 50 in the upright position is slidable in the vertical direction against the support frames 40. The maintenance step 50 is rotatable to be in the advanced state as illustrated in FIG. 11 when the lower end portion 53 is slid to the support frames 40. With the maintenance step 50 with this configuration, the operator can move the maintenance step 50 from the retracted state to the advanced state simply by pulling the maintenance step 50 upward and then tipping it toward the support frames 40.

In the retracted state, as illustrated in FIG. 7, the first maintenance step 50A and the second maintenance step 50B according to the above example are disposed in the center between the first body unit 24A and the second body unit 24B. By providing the two maintenance steps 50, the first maintenance step 50A and the second maintenance step 50B, for the lifting/lowering space S1 of the first lifting/lowering rail 21A and the lifting/lowering space S2 of the second lifting/lowering rail 21B, the size of one maintenance step 50 can be reduced, which makes handling by the operator easier.

In the retracted state, the maintenance step 50, which is disposed in the upright position between the first body unit 24A and the second body unit 24B, serves as a wall separating the lifting/lowering space S1 of the first lifting/lowering rail 21A from the lifting/lowering space S2 of the second lifting/lowering rail 21B, as illustrated in FIGS. 4 and 7. This can ensure the safety of the operator even if one of the first lifting/lowering rail 21A and the second lifting/lowering rail 21B is activated while the operator is working in the lifting/lowering space S1 or S2 of the other of the first lifting/lowering rail 21A and the second lifting/lowering rail 21B.

As illustrated in FIGS. 4, 6 and 11, the carriage lifting/lowering device 20 according to the above example includes the stopper 60 attached to the support frame 40 to maintain the maintenance step 50 in the retracted state, and the switches 70 and 70 configured to detect whether the stopper 60 is attached to the support frame 40. The controller 80 restricts driving of the first lifting/lowering drive unit 25A and second lifting/lowering drive unit 25B when the switches 70 and 70 detect that the stopper 60 is not attached. With this configuration, when the stopper 60 is removed by the operator, that is, when the operator is highly likely to be performing maintenance work on the carriage lifting/lowering device 20, the first lifting/lowering drive unit 25A is prohibited from lifting and lowering the first lifting/lowering rail 21A and the second lifting/lowering drive unit 25B is prohibited from lifting and lowering the second lifting/lowering rail 21B, and thus the safety of the operator can be ensured.

Figure 10:
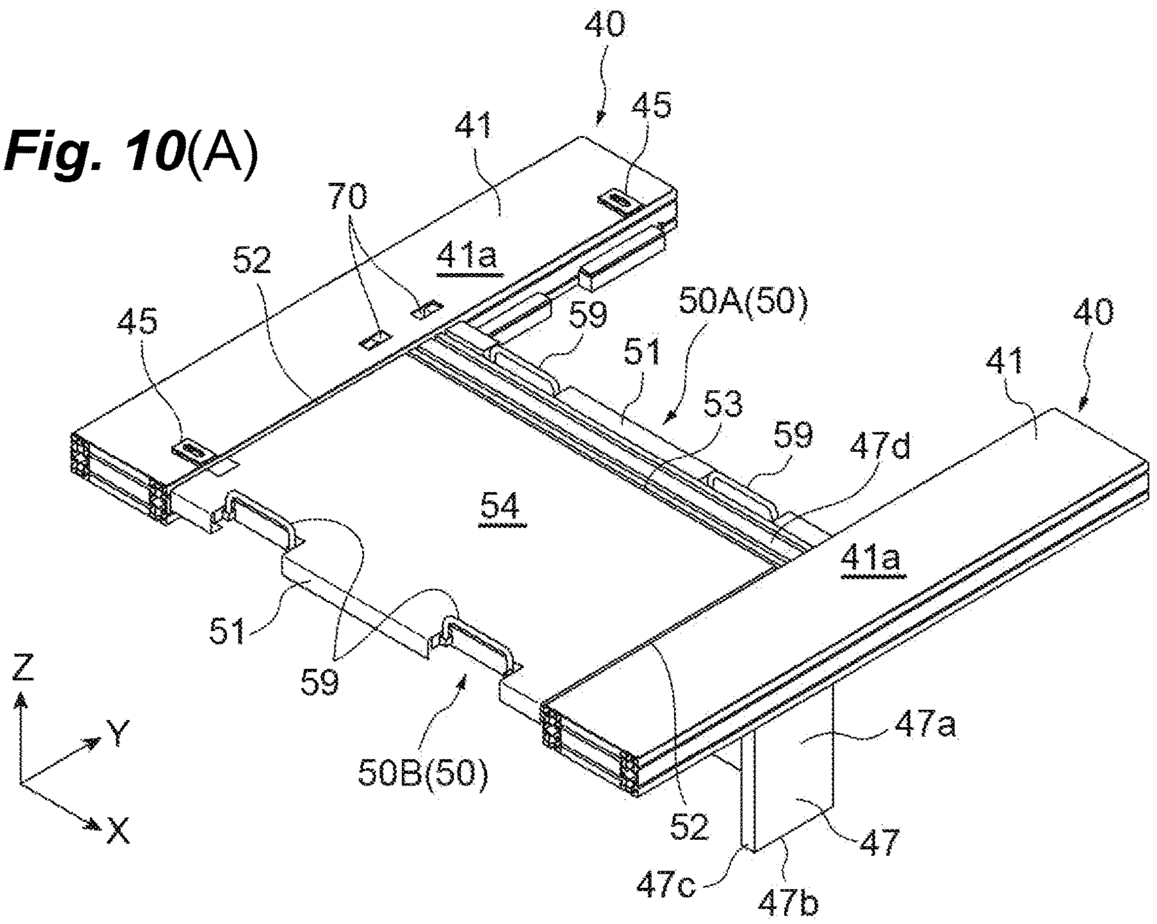
FIG. 10(A) is a perspective view of one maintenance step in the advanced state.
FIG. 10(B) is an enlarged perspective view illustrating a side portion of a support frame.
Figure 10:
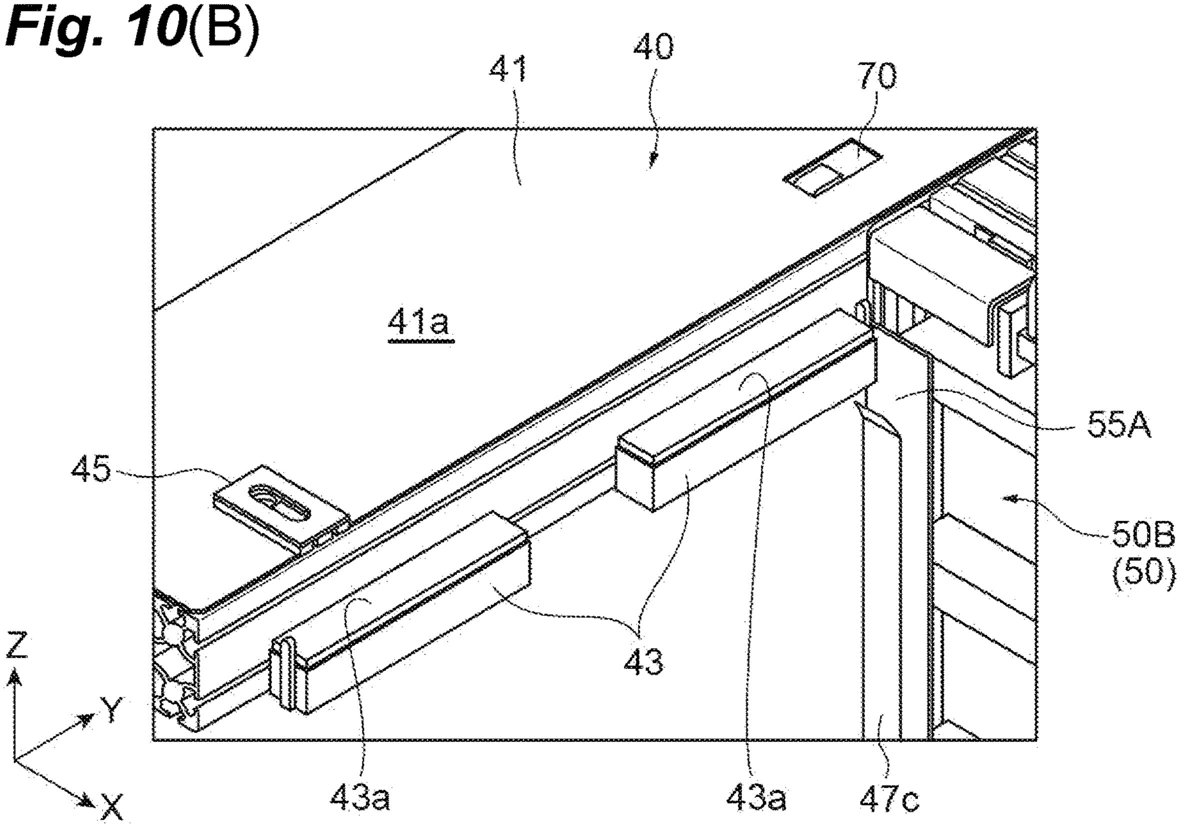

In the carriage lifting/lowering device 20 according the above example, as illustrated in FIG. 10, the locking portions 45 are provided to lock the boarding face 54 side of the maintenance step 50. This prevents the maintenance step 50 from lifting from the support frames 40 even when some force is applied from below the maintenance step 50, and thus the safety of the operator can be ensured.

Although one example has been described above, our devices are not limited to the example, and various modifications may be made within the scope not departing from the spirit of this disclosure.

In the carriage lifting/lowering device 20 according to the above example, the transport carriages 10 and 10 traveling on two respective traveling rails 5A and 5A and two respective traveling rails 5B and 5B disposed in the same plane are configured to travel in opposite directions from each other, and the first lifting/lowering unit 22A is used as a lifting/lowering device dedicated to lifting and the second lifting/lowering unit 22B is used as a lifting/lowering device dedicated to lowering. However, the example is not limited to this structure. For example, the transport carriages 10 and 10 traveling on the two respective traveling rails 5A and 5A and the two respective traveling rails 5B and 5B disposed in the same plane may be configured to travel in the same direction, and the first lifting/lowering unit 22A and the second lifting/lowering unit 22B may be dedicated to lifting or lowering.

The carriage lifting/lowering device 20 according to the above example and modifications is described by an example in which the controller 80 is provided to the first body unit 24A. However, the controller 80 may be provided at a location separated from the carriage lifting/lowering device 20, and the controller 80 and the carriage lifting/lowering device 20 may be connected communicably by wired or wireless communication.

The carriage lifting/lowering device 20 according to the above example and modifications is described with an example in which the first maintenance step 50A and the second maintenance step 50B in the retracted state are disposed in the upright position between the first body unit 24A and the second body unit 24B. However, the example is not limited to this structure. For example, the first maintenance step 50A may be retracted along the first body unit 24A and the second maintenance step 50B may be retracted along the second body unit 24B.

The carriage lifting/lowering device 20 according to the above example and modifications is described with an example in which the two maintenance steps, the first maintenance step 50A and the second maintenance step 50B, are provided. However, a single maintenance step 50 may be provided.

The carriage lifting/lowering device 20 according to the above example and modifications is described with an example in which the maintenance step 50 movable between the retracted state and the advanced state is housed. However, the maintenance step 50 stored in a storage location or the like may be placed at the time of maintenance. Even in this example, the workability of maintenance work can be improved compared to boarding a lift of an aerial work vehicle.

The above example is described with an example of boarding the support frame 40 using a ladder or other means at the time of during maintenance. However, for example, a ladder or slope accessible to the support frame 40 of the carriage lifting/lowering device 20 may be permanently provided.

The invention claimed is:

1. A carriage lifting/lowering device comprising:

a first lifting/lowering rail and a second lifting/lowering rail that are liftably and lowerably provided corresponding to two respective laid rails parallel to each other in a same plane in an overhanging state;

a first lifting/lowering drive unit configured to lift and lower the first lifting/lowering rail;

a second lifting/lowering drive unit configured to lift and lower the second lifting/lowering rail;

a first body having a first face orthogonal to an arranging direction of the two laid rails, and configured to movably support the first lifting/lowering rail along the first face in a lifting/lowering direction;

a second body having a second face facing the first face in the arranging direction, and configured to movably support the second lifting/lowering rail along the second face in the lifting/lowering direction; and a pair of support frames disposed across the first body and the second body, with a maintenance step disposed across the pair of support frames, the maintenance step having a boarding face on which an operator is able to board, wherein the pair of support frames are disposed in an extending direction of the first lifting/lowering rail and the second lifting/lowering rail, and sandwich a lifting/lowering space in which the first lifting/lowering rail and the second lifting/lowering rail are lifted and lowered;

the maintenance step provided movably between a retracted state, in which the maintenance step retracts from the lifting/lowering space by being placed in an upright position with the boarding face orthogonal to the arranging direction, and an advanced state, in which the maintenance step advances into the lifting/lowering space when the boarding face is placed on the support frames to be orthogonal to the lifting/lowering direction;

the maintenance step is supported by the support frames at an upper end portion of the maintenance step in the retracted state, the maintenance step in the upright position is slidable in the lifting/lowering direction against the support frames, and the maintenance step is rotatable to be in the advanced state when a lower end portion of the maintenance step is slid to the support frames.

2. The carriage lifting/lowering device according to claim 1, wherein the maintenance step includes:

a first maintenance step provided to advance into the lifting/lowering space of the first lifting/lowering rail in the advanced state; and a second maintenance step provided to advance into the lifting/lowering space of the second lifting/lowering rail in the advanced state, and the first maintenance step and the second maintenance step are disposed in a center between the first body unit in the retracted state and the second body unit in the retracted state.

3. The carriage lifting/lowering device according to claim 1, further comprising:

a controller configured to control the first lifting/lowering drive unit and the second lifting/lowering drive unit;

a stopper attached to the support frames to maintain the maintenance step in the retracted state; and a detector configured to detect whether the stopper is attached to the support frames, wherein the controller restricts driving of the first lifting/lowering drive unit and the second lifting/lowering drive unit when the detector detects that the stopper is not attached.

4. The carriage lifting/lowering device according to claim 1, wherein the support frames are provided with a locking portion configured to lock the boarding face of the maintenance step in the advanced state.

5. The carriage lifting/lowering device according to claim 1, further comprising:

a controller configured to control the first lifting/lowering drive unit and the second lifting/lowering drive unit;

a stopper attached to the support frames to maintain the maintenance step in the retracted state; and a detector configured to detect whether the stopper is attached to the support frames, wherein the controller restricts driving of the first lifting/lowering drive unit and the second lifting/lowering drive unit when the detector detects that the stopper is not attached.

6. The carriage lifting/lowering device according to claim 2, further comprising:

a controller configured to control the first lifting/lowering drive unit and the second lifting/lowering drive unit;

a stopper attached to the support frames to maintain the maintenance step in the retracted state; and a detector configured to detect whether the stopper is attached to the support frames, wherein the controller restricts driving of the first lifting/lowering drive unit and the second lifting/lowering drive unit when the detector detects that the stopper is not attached.

7. The carriage lifting/lowering device according to claim 1, wherein the support frames are provided with a locking portion configured to lock the boarding face of the maintenance step in the advanced state.

8. The carriage lifting/lowering device according to claim 2, wherein the support frames are provided with a locking portion configured to lock the boarding face of the maintenance step in the advanced state.

9. The carriage lifting/lowering device according to claim 3, wherein the support frames are provided with a locking portion configured to lock the boarding face of the maintenance step in the advanced state.

10. The carriage lifting/lowering device according to claim 5, wherein the support frames are provided with a locking portion configured to lock the boarding face of the maintenance step in the advanced state.

11. The carriage lifting/lowering device according to claim 6, wherein the support frames are provided with a locking portion configured to lock the boarding face of the maintenance step in the advanced state.

* * * * *